United States Patent [19]
Elmer et al.

[11] 3,986,179
[45] Oct. 12, 1976

[54] FAULT-TOLERANT CCD MEMORY CHIP

[75] Inventors: Ben R. Elmer, Glendale; Wallace E. Tchon, Phoenix, both of Ariz.

[73] Assignee: Honeywell Information Systems, Inc., Phoenix, Ariz.

[22] Filed: June 30, 1975

[21] Appl. No.: 591,666

[52] U.S. Cl. .................... 340/173 BB; 340/173 R
[51] Int. Cl.² .................................... G11C 11/34
[58] Field of Search ... 340/173 CA, 173 R, 173 BB, 340/172.5

[56] References Cited
UNITED STATES PATENTS

| | | | |
|---|---|---|---|
| 3,750,116 | 7/1973 | Kemerer | 340/173 BB |
| 3,772,652 | 11/1973 | Hilberg | 340/173 BB |
| 3,855,580 | 12/1974 | Lighthall et al. | 340/173 R |
| 3,886,528 | 5/1975 | Irani et al. | 340/173 R |

*Primary Examiner*—Thomas A. Robinson
*Attorney, Agent, or Firm*—Nicholas Prasinos; Ronald T. Reiling; William W. Holloway, Jr.

[57] ABSTRACT

The invention comprises a CCD memory chip. A CCD chip is comprised of a plurality of arrays, each of which is in turn comprised of a plurality of CCD registers. A serial addressing system may be used to determine which of the arrays is accessed. Fault-tolerance with respect to defective arrays is achieved by the combination of having only the address circuits for properly functioning arrays form the bits of an N-bit addressing shift register, (whereas the address circuits for improperly functioning arrays are shorted such that they do not form a bit of the N-bit address shift register,) and disabling the voltage delivered to a faulty array. The control circuitry includes the address circuitry and further includes means for controllably providing power to the array components. A plurality of arrays comprises a chip having pads for connecting the chip to the rest of the system.

22 Claims, 6 Drawing Figures

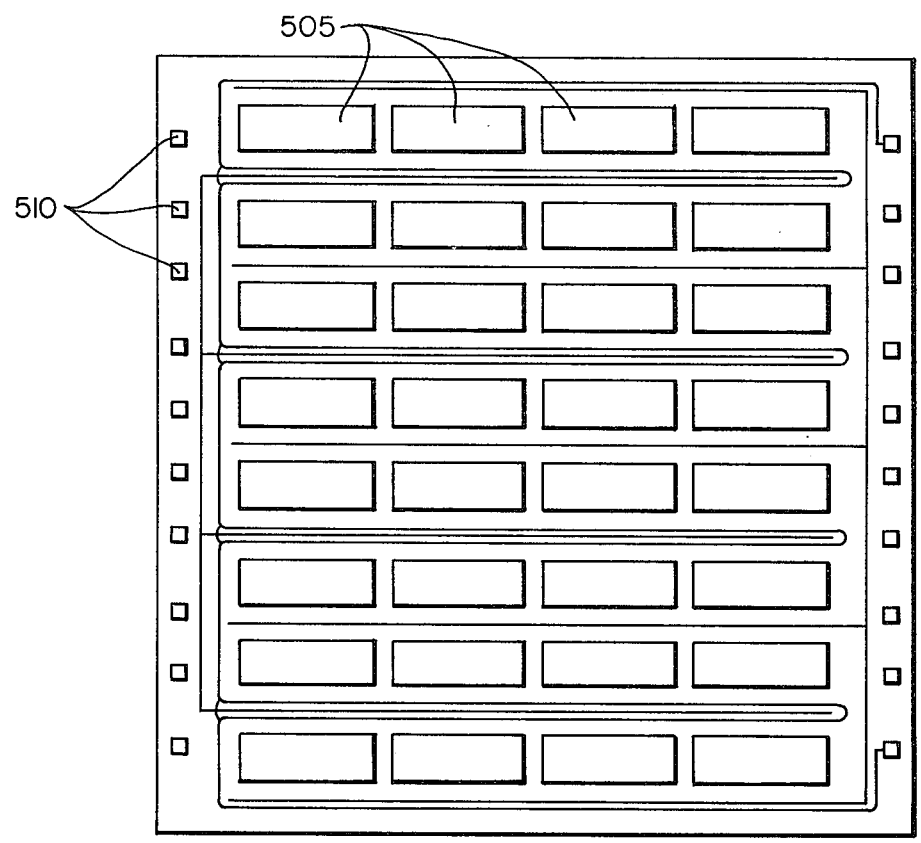
*FIG. 5*
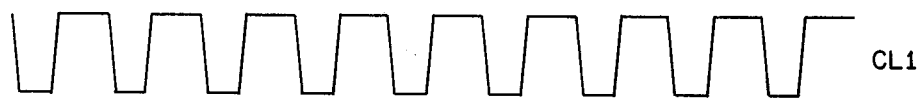
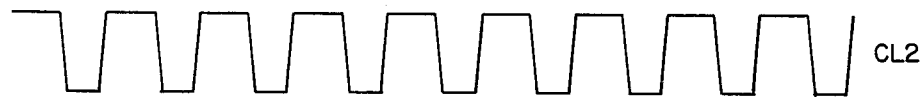
*FIG. 6*

FAULT-TOLERANT CCD MEMORY CHIP

RELATED APPLICATIONS

The following applications assigned to the same assignee named herein are incorporated by reference to the instant application:

No. 1. "Multi-Phase Series-Parallel-Series Charge Coupled Device Registers" invented by Ben R. Elmer, et al, Ser. No. 592,156, filed on June 30, 1975.

No. 2. "Multi-Phase Series-Parallel-Series Charge Coupled Device Registers with Simplified Input Clocking" invented by Ben R. Elmer, et al, Ser. No. 591,724, filed on June 30, 1975.

No. 3. "Charge Injectors for CCD Registers" invented by Wallace E. Tchon, Ser. No. 592,147, filed on June 30, 1975.

No. 4. "Charge Detectors for CCD Registers" invented by Ben R. Elmer and Wallace T. Tchon, Ser. No. 591,667, filed on June 30, 1975.

No. 5. "CCD Register Interface with Partial-Write Mode", invented by Ben R. Elmer and Wallace E. Tchon, Ser. No. 591,723, filed on June 30, 1975.

No. 6. "Chain Selection Scheme in a Fault-Tolerant Mode and Circuits for Implementing Same", invented by Ben R. Elmer, Ser. No. 592,155 filed on June 30, 1975.

BACKGROUND OF THE INVENTION

1. Field of the Invention

This invention relates generally to CCD memory chips and in particular to high density fault-tolerant CCD memory chips which include serial addressing means.

2. Description of the Prior Art

In order to effectively utilize CCD technology, high density must be obtained. The smallest possible cell sites for storage of charge is desirable, as well as an optimum spacial configuration of cell sites forming a register in order to achieve the high density. In practical applications of CCDs, the density problem is present not only at a configurational level within the register, but also with respect to control circuitry for interfacing between the registers and the remainder of the data processing system. High density CCD storage registers are described in Related Applications Nos. 1 and 2. Injector, sense amplifier, and interface circuitry for each register are described in Related Applications Nos. 3, 4 and 5 respectively.

In order to achieve the desired density levels, concern for minimization of spacial requirements must extend to a configurational level beyond that of the register. For example, registers may advantageously be grouped in parallel to form arrays. Whenever an array is accessed, all of the registers may work in parallel, that is, they READ, WRITE or REFRESH simultaneously over a plurality of data buses. In this manner, control circuitry is used for a plurality of registers and is thereby minimized. A chip may receive an address corresponding to a single array and proceed to address in parallel the plurality of registers comprising that array. Each of the registers then transmits the data within it serially, since the CCD registers are serial storage devices. Requirements of such a system therefore include an addressing scheme for the arrays on the chips forming a memory module.

Whenever data is to be accessed (read) or stored (written) it is necessary to address the memory area where the date is, or is to be, stored. This requires some form of addressing scheme. Two basic types of addressing schemes are serial and parallel. Serial addressing requires only one lead or wire to the storage unit and hence serial addressing offers advantages of simplicity of design, and lessens area and power requirements. However, it is generally a relative slow method, since it requires transmission of data bit-by-bit, until all the bits have been transmitted.

Once an address is transmitted to memory area, whether it be by serial or parallel method, this address must be used in some way to determine which area within the general memory is to be accessed. Most prior art addressing schemes assume that all parts of the memory system whether it be a chip or some other form of system, are 100% operational. In this manner, each area is assumed to have a unique address and each address corresponds to a working and utilizable data area. However, at a chip level, 100% working capability of storage parts implies a very high processing cost for chips. If a chip could contain areas, such as arrays, some of which were defective, substantial cost savings could result. However, this would require a fault-tolerant addressing scheme, that is, one which avoided the malfunctioning arrays. There are, in general, two ways of avoiding addressing of defective storage areas. One is by software control. However, this requires storing the addresses corresponding to defective storage areas in some part of the system and then comparing an address to this stored address in order to avoid addressing of a defective area. Clearly, this is a slow and costly way of achieving fault-tolerance. A more desirable way is by a hardware scheme which automatically prevents addressing of the defective areas. Such a fault-tolerant addressing system is described in Related Application No. 6. In addition to fault-tolerant addressing, the CCD chip must contain other control circuitry for efficiently achieving fault-tolerance and high density.

OBJECTS OF THE INVENTION

It is an object of the present invention therefore to provide a high-density, fault-tolerant CCD memory chip.

It is another object of the present invention to provide a CCD memory chip incorporating a fault-tolerant addressing system.

It is yet another object of the present invention to provide a CCD chip which requires a minimum of area and power.

It is still another object of the present invention to provide a fault-tolerant CCD chip which allows for defective arrays within a chip by avoiding addressing and provision of power to said defective areas by hardware means.

Other objects and benefits of the present invention will become more apparent to those of ordinary skill in the art when read in conjunction with the drawings contained herein.

SUMMARY OF THE INVENTION

The invention comprises a CCD memory chip. A CCD chip is comprised of a plurality of arrays, each of which is in turn comprised of a plurality of CCD registers. All of the registers comprising an array are accessed simultaneously, but only one of N arrays is accessed at a time. A serial addressing system is used to determine which of the arrays is accessed. Fault-tolerance with respect to defective arrays is achieved by having only the address circuits for properly functioning arrays form N bits of an N-bit addressing shift register, whereas the address circuits for improperly functioning arrays are shorted such that they do not form a bit of the N-bit address shift register. Also associated with each array is a unique set of multiphase drivers for driving the registers comprising the array.

The control circuitry includes the address circuitry and further includes means for providing power to the array components. These means include circuits for providing a reset signal to the address circuitry, and a refresh signal and gating means for clocks for driving the address circuitry and the arrays. Power is conditionally provided to the gating means depending on the functional condition of the array. In this manner, power is not provided to faulty arrays, thereby decreasing the power requirements of the chips. A plurality of arrays comprises a chip having pads for connecting the chip to the rest of the data processing system. The pads are for bi-directional data buses and voltage buses, the latter for control signals and static and dynamic (clock) power signals for driving array circuitry.

BRIEF DESCRIPTION OF THE DRAWINGS

FIG. 5 is a diagram showing an alignment of arrays and busing pads on a chip.

FIG. 6 is a timing diagram showing the phase relationships of the system clocks.

DESCRIPTION OF THE PREFERRED EMBODIMENT

Figure 1:
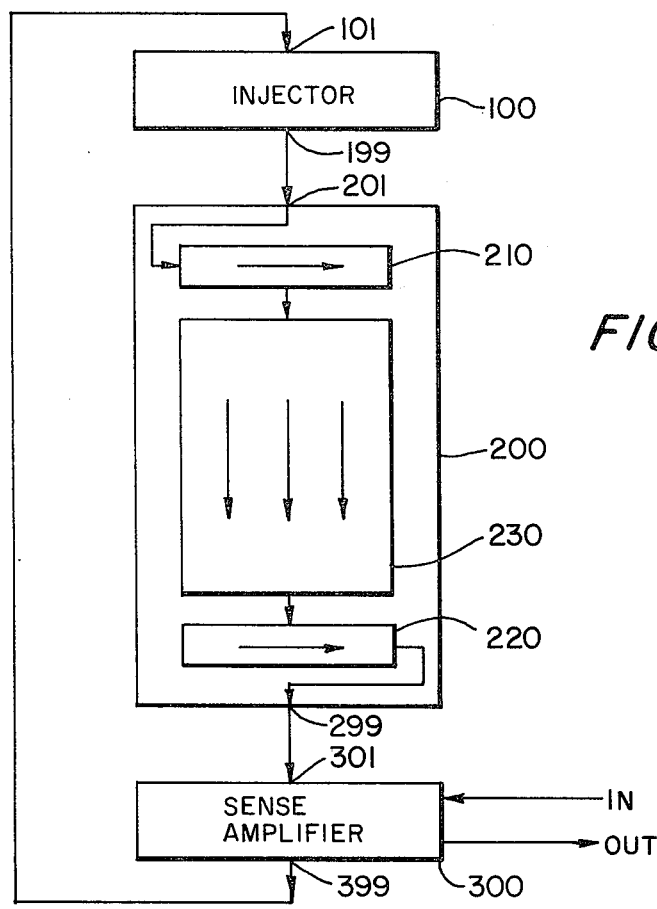
FIG. 1 is a block diagram of an SPS CCD register system with an associated injector and sense amplifier.

Referring now to FIG. 1, a block diagram of a CCD register storage system is shown. All of the components in the CCD register storage system are integrated within a single semiconductor chip which may contain a plurality of such register systems. It is noted that a single line connecting various blocks within FIG. 1 may represent a plurality of connecting leads. Also, the unconnected arrowheads in FIG. 1 represent direction of flow of information bits. The basic element of FIG. 1 is block 200 which represents an SPS register. SPS register 200 is comprised of three units: input serial register 210, output serial register 220 and central storage register 230. The input terminal 201 of register 200 is effectively the input terminal to input serial register 210. Bits of information in the form of charge packets are injected into input section 210 and are serially propagated through section 210. CCD sites (or cells) comprising section 210 are also connected to central section 230. Section 210 is coupled to section 230 via a row of gates which allow parallel transfer of information into central section 230. Information bits are then propagated through the lengthwise section of central section 230. In the preferred embodiment, central section 230 is eight bits wide by 32 effective-bits long, thereby providing a 256-bit shift register. The arrows inside of section 230 represent the parallel propagation of information through section 230. At the other (output) end of section 230, the information bits in the form of charge packets are transferred into output serial section 220. Upon receiving the information bits, output section 220 transfers the bits serially to the output section output terminal, which is effectively the output terminal 299 of SPS register 200.

SPS register 200 receives, transfers, and transmits information in the form of a small packets of charge in the order of 50 to $230 \times 10^{-15}$ Coulombs. Clearly, these charges are not of a level equivalent to logic signals at a system level. Accordingly, the register must be buffered in order to handle and transmit appropriate input and output signals. (Inventions directed to such buffering and conversion problems are described in Related Application Nos. 3, 4 and 5.)

The packets of charge emitted from SPS register 200 must be sensed and amplified, i.e. refreshed, before further propagation. Additionally, they must be converted to appropriate logic level before they can be bused to other systems components. This is accomplished by sense amplifier 300 which has its input terminal 301 coupled to the output terminal 299 of SPS register 200. Amplifier 300 must be highly sensitive to be able to sense the very small packets of charge after they have been transferred through and decayed within the shaft register 200. It is also desirable to periodically perform a conventional refresh of the information bits stored in the register 200. This is performed by simply serially shifting the packets of charge from the register to the amplifier, and reinjecting them after they have been amplified. This operation is identical to a READ operation with the exception that the latter also entails busing the information, at a logic (MOS) level, to other system components. Such output busing is done over output line OUT shown in FIG. 1.

Input busing may be done via line IN to amplifier 300. Accordingly, in this CCD storage system, amplifier 300 is considered to include interface circuitry responsive to signals for directing the flow of information through the system to perform REFRESH, READ and WRITE operations.

An output terminal 399 of amplifier 300 is also connected to the input terminal 101 of injector circuit 100, thereby forming an input path to register 200. Injector 100 acts to convert the system level signals into appropriate charge packets. These charge packets are then transferred from the output terminal 199 of injector circuit 100 to the input terminal 201 of register 200. (For detailed description of multiphase SPS registers, see Related Application Nos. 1 and 2.)

Figure 2:
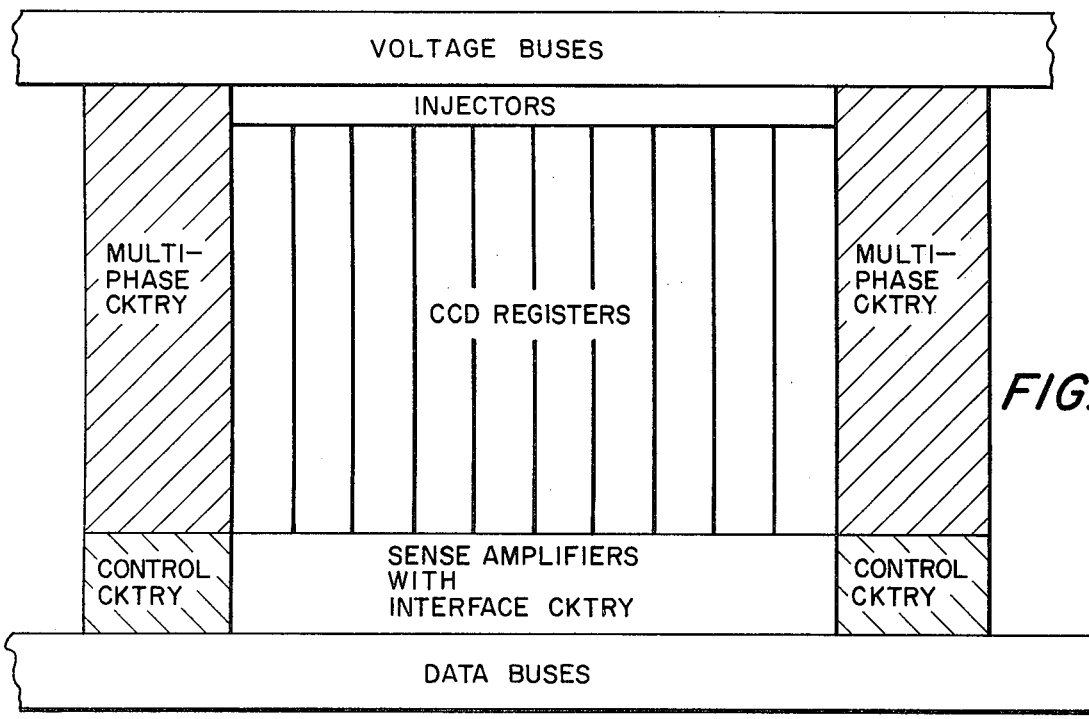
FIG. 2 is a block diagram of an embodiment of an array comprised of a plurality of CCD registers such as those shown in FIG. 1.

Referring now to FIG. 2, a configuration for a single array comprised of a plurality of CCD registers is shown. In the preferred embodiment of the invention, each array comprises 10 registers; however, those of ordinary skill in the art will readily recognize that alternate numbers of registers are possible depending on the particular system and requirements thereof. Each of the CCD storage registers requires an associated injector circuit, an associated sense amplifier and associated interface circuitry, which are also shown in FIG. 2.

In addition to the 10 registers and related circuitry, each array is also comprised of two sets of multiphase drivers for driving the 10 registers and related circuitry in parallel. Each array is also comprised of control and address circuitry and is coupled to voltage and data buses. As can be seen in FIG. 2, optimal configuration of the components required for and associated with each array is essential for achieving high density. In the preferred embodiment of the invention, each array is approximately 60 × 90 mils. Since the effective storage area within the registers comprising each area is about 2052 mil², the configuration shown in FIG. 2 utilizes about 38% (2052/5400) of the required area for storage, which is a relatively high density utilization rate.

Figure 3:
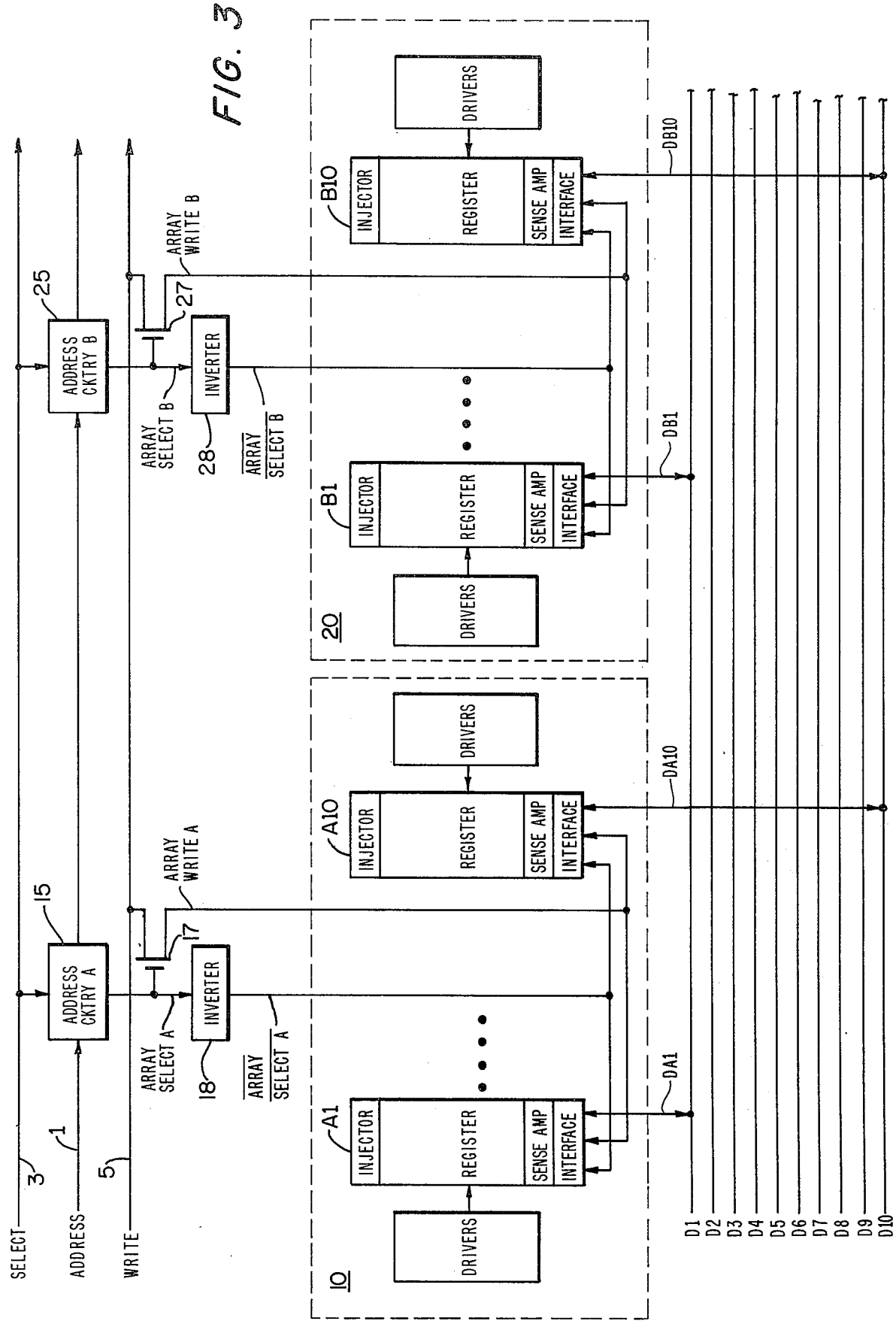
FIG. 3 is a diagram of the arrays shown in FIG. 2 with associated address circuitry and data buses shown in additional detail.

Referring now to FIG. 3, arrays comprised of a plurality of CCD registers such as those described above and associated address circuitry are shown in another perspective. Once again it is noted that in the preferred embodiment of the invention, each array comprises 10 registers, and each of the CCD storage registers requires an associated injector circuit, an associated sense amplifier and associated interface circuitry. Accordingly, hereinafter the term "register system" is used to refer to the combination of CCD registers and these associated devices. Accordingly, array 10 of FIG. 3 is comprised of 10 register systems, A1 to A10. Similarly, array 20 is comprised of 10 register systems, B1 to B10. There may be a multiplicity of arrays so aligned on a chip, the precise number of which is dependent upon the size of the chip (and other factors). Common data buses are used to bus data in and out of all of the arrays 10, 20 etc. If bi-directional data buses are used, requirements for data buses will be only ½ as great as when uni-directional buses are used. This has clearly beneficial effects with respect to density. Accordingly, each of the data buses is assumed to be bi-directional. If only one array is selected for operation at any one time, the data buses will carry logic signals corresponding to data bits to or from only one array at a time, despite the fact that a multiplicity of arrays are connected to the data bus. Although only one array is addressed at any one time, all of the register systems comprising that array simultaneously transmit or receive data when the array is selected. Accordingly, since there are 10 register systems in each of the arrays, there is a requirement for 10 data buses, D1 to D10, to carry data in parallel to and from the 10 register systems. In FIG. 3, data bus D1 is coupled via data bus DA1 to register system A1, via DB1 to register system B1, etc. Similarly, data bus D10 is coupled via data bus DA10 to register system A10, via data bus DB10 to register system B10 etc.

In order to determine which array is to be selected for I/O operation, address circuitry is required. Each array has associated with it unique address circuitry, address circuitry 15 being associated with array 10, address circuitry 25 being associated with array 20, etc. An address signal ADDRESS is bused via line 1 serially to the address circuits for all of the arrays. The output signal from each of the address circuits is a signal called ARRAY SELECT. For address circuitry A, the signal is ARRAY SELECTED A, for address circuitry B, the signal is ARRAY SELECT B etc. The arrays also receive in parallel a WRITE signal over line 5, and a SELECT signal over line 3. The WRITE signal is coupled to array 10 via a transistor 17 and to array 20 via transistor 27 etc. The gates of these transistors 17, 27 are coupled to the appropriate ARRAY SELECT signal; the gate of transistor 17 is coupled to ARRAY SELECT A, the gate of transistor 27 is coupled to ARRAY SELECT B. In this manner, the mutual occurrence of an ARRAY SELECT signal and a WRITE signal results in an ARRAY WRITE signal for the addressed array. In the preferred embodiment, the interface circuitry is designed to be responsive to $\overline{\text{ARRAY}}$ $\overline{\text{SELECT}}$ circuitry. Accordingly, the ARRAY SELECT signals are passed through inverters to generate $\overline{\text{ARRAY SELECT}}$ signals. Both the $\overline{\text{ARRAY SELECT}}$ and ARRAY WRITE signals are sent to all 10 of the register systems comprising the array; $\overline{\text{ARRAY SELECT}}$ A and ARRAY WRITE A are bused to each of register systems A1 to A10 of array 10, $\overline{\text{ARRAY SELECT}}$ B and ARRAY WRITE B are bused to each of register systems B1 to B10 of array 20.

Figure 4:
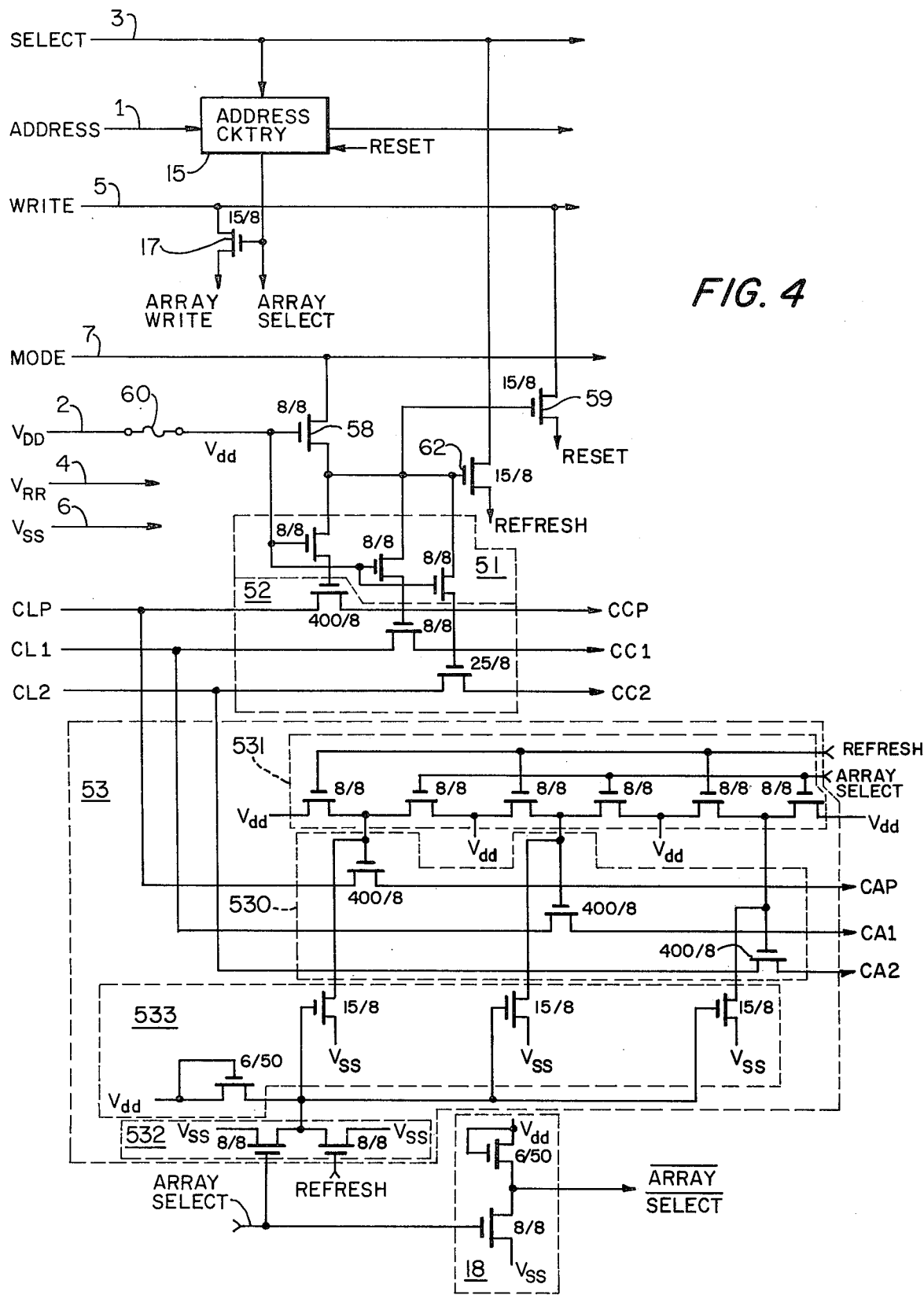
FIG. 4 is a detailed diagram of control circuitry for an array comprised of a plurality of CCD register systems such as those shown in FIG. 1.

Referring now to FIG. 4, control circuitry for an array is shown in detail. Voltage and signal buses for the plurality of arrays commonly addressed are shown as lines 1 to 7. The signals over these lines are bused to all of the arrays corresponding to an address register. (This is also true of the busing of the three system clocks, CLP, CL1 and CL2.) The ADDRESS signals are serially sent to address circuits for all of the arrays. As described in Related Application No. 6, address circuitry such as circuit 15 shown in FIG. 4, generates an ARRAY SELECT signal and in combination with transistor 17, generates an ARRAY WRITE signal. The MODE signal, bused in parallel to all of the arrays over line 7, is conditionally used in combination with transistor 59 to gate the WRITE signal generating a RESET signal for address circuitry 15. The existence of the MODE signal at the gate of transistor 59 is conditional upon the fuse 60 being linked (i.e., providing a short circuit) so as to provide an enabling $V_{DD}$ signal to transistor 58. ($V_{DD}$ is considered to be the voltage (0 volts) delivered at a system level over a voltage bus, whereas $V_{dd}$ is the same voltage, but at an array level if fuse 60 is shorted.) The gated MODE signal from transistor 58 is also used to gate transistor 62. In this manner, the SELECT signal is passed through transistor 62 as a REFRESH signal for the array.

Circuit 51 contains three transistors gated by $V_{dd}$ to conditionally pass the MODE signal in parallel to gate the three transistors comprising circuit 52. Circuit 52 gates clocks CLP, CL1 and CL2 to form clocks CCP, CC1 and CC2. These latter clock signals are used for driving the address circuitry 15. Signals CCP, CC1 and CC2 occur when the MODE signal is on (low), corresponding to the addressing mode of operation.

Circuit 53 is used to gate clocks CLP, CL1 and CL2 to form clocks CAP, CA1 and CA2 respectively. These latter signals are used for driving the register systems comprising each array. (Description of the register systems and the address circuitry in Related Application Nos. 1 to 6 shows clocks CLP, CL1 and CL2. Substitution of clocks CCP, CC1 and CC2 for clocks CAP, CA1 and CA2 respectively is necessary when forming arrays for usage in a memory system such as the one described by this application. This modification is within the skill of those familiar with the art.) Section 530 of circuit 53 comprises three transistors for gating clocks CLP, CL1 and CL2. These transistors are responsive (in parallel) to signals from sections 531 and 533. Section 531 is comprised of three parallel OR gates each responsive to either a REFRESH or an ARRAY SELECT signal. Section 533 is responsive to section 532 which also acts as an OR gate responsive to a REFRESH or an ARRAY SELECT signal. For the transistors in section 530 to transmit clock signals CAP, CA1 and CA2, the OR gates of section 531 must be on and the three parallel transistors of section 533 must be off. Section 531 turns clocks CAP, CA1 and CA2 on and section 533 turns these clocks off. Operation of clocks CAP, CA1 and CA2 correspond to a data transfer mode of operation which normally occurs after an addressing mode of operation is completed. The data transfer mode of operation may be for a READ or WRITE operation (which both require the presence of an ARRAY SELECT signal) or for a REFRESH operation. Of the 64 arrays combined to form an addressing unit (i.e. the address circuits of the 64 arrays from a single address register), only one will be enabled to perform a READ or WRITE at any one time. To assure that all of the arrays are refreshed with the desired frequency (which in the preferred embodiment is at least once every 2 microseconds), a REFRESH signal must be generated with this frequency. The effect of the REFRESH signal is to simultaneously refresh all 64 arrays. All arrays may be refreshing while data is transferred to or from one selected array. ARRAY SELECT signals are transformed into $\overline{\text{ARRAY SELECT}}$ signals by static inverter 18.

Referring now to FIG. 5, a configuration of arrays on a chip is shown. In the preferred embodiment, a chip is 500 mils by 500 mils. The arrays 505 are aligned in 4 columns and 8 rows. Twenty pads 510 for connection of the buses to the system, for voltage clock, addressing and I/O signals, are on the periphery of the chip.

Referring now to FIG. 6, the phase relationship of the system clocks in shown. Clock CLP is a 2 MHZ clock and Clocks CL1 and CL2 are 1 MHZ clocks. Clock CL1 and clock CL2 are 180° out of phase with respect to each other and are phase related to clock CLP.

It is assumed that approximately 53% of the arrays on a chip are properly functioning, the rest malfunctioning, and a chip yield of approximately 95% may be realistically achieved. Therefore, an effective yield of approximately 50% for arrays on a workable chip may be achieved by the present invention. Each register has an effective storage of 256 bits and 10 registers are driven in parallel for each array. A 50% yield of the 32 arrays on a chip yields 16 effective arrays. Combining these figures, the technology of the present invention yields 4K × 10 bits (or 40K) on each CCD chip.

In the preferred embodiment, all transistors are MOSFET transistors. Accordingly, low signals enable the transistors and high signals turn the transistors off. In the diagrams, sizes for the transistors are given in terms of surface area of a semi-conductor chip. The sizes are shown as width over length (w/l) in microns and are not in anyway meant to be restrictive as alternate geometries may be employed to the same effect.

The above description is included to illustrate the operation of the preferred embodiment and is not meant to limit the scope of the invention. The scope of the invention is to be limited only to the following claims. From the above discussion, many variations will be apparent to one skilled in the art that would yet be encompassed by the spirit and scope of the invention.

What is claimed is:

1. Control circuitry responsive to control, address and clock signals for enabling operation of an array comprised of a plurality of storage registers operated in parallel, said circuitry comprising:
    first gating means responsive to a first control signal and coupled to said clock signals for generating first conditional clock signals, said first control signal being conditionally coupled to said first gating means dependent upon the fault-free status of said array;
    second gating means responsive to a second control signal and a first array control signal and coupled to said clock signals for generating second conditional clock signals; and
    address circuitry responsive to said address signals for generating said first array control signal and a second array control signal, said first array control signal indicating selection of said array, said second array control signal indicating operation of said array in a WRITE mode.

2. The circuitry of claim 1 wherein said circuitry is responsive to said first conditional clock signals.

3. The circuitry of claim 1 wherein said array is responsive to said second conditional clock signals.

4. The circuitry of claim 1 wherein said conditional coupling comprises a first transistor responsive to a conditional array voltage.

5. The circuitry of claim 4 wherein said conditional voltage is coupled to said transistor via a breakable fuse, said fuse comprising a short circuit only when said array is fault-free.

6. The circuitry of claim 4 further comprising first means for generating said second control signal, said first means coupled to a first of said address signals and responsive to said first transistor.

7. The circuitry of claim 6 wherein said first means comprises a second transistor.

8. The circuitry of claim 6 wherein said second control signal corresponds to a REFRESH mode of operation.

9. The circuitry of claim 4 further comprising second means coupled to said address circuitry and to a second of said address signals and responsive to said first transistor for generating a reset signal.

10. The circuitry of claim 9 wherein said second means comprises a third transistor.

11. The circuitry of claim 1 wherein said address circuitry includes a fourth transistor coupled to receive a second of said address signals and responsive to said first array control signal for generating said second array control signal.

12. The circuitry of claim 4 wherein said first gating means comprises a first set of transistors each conditionally coupling one of said clock signals to one of said first conditional clock signals respectively.

13. The circuitry of claim 12 wherein said conditional coupling comprises a second set of transistors responsive to said first transistor.

14. The circuitry of claim 4 wherein said second gating means comprises a third set of transistors each conditionally coupling one of said clock signals to one of said second conditional clock signals respectively.

15. The circuitry of claim 14 wherein said second gating means further comprises a set of OR gates responsive to said first array control signal and to said second control signal for enabling said conditional coupling via said third set of transistors.

16. The circuitry of claim 14 wherein said second gating means further comprises:
    an OR gate responsive to said first array control signal and to said second control signal; and
    a fourth set of transistors conditionally coupled to said third set of transistors respectively for disabling said conditioning coupling via said third set of transistors, said fourth set of transistors disabled by said OR gate.

17. The circuitry of claim 1 further comprising inverting means coupled to said first array control signal for generating a third array control signal which is the inverse of said first array control signal.

18. Fault-tolerant control circuitry responsive to control and voltage signals for enabling operation of an array comprised of a plurality of storage registers operated in parallel, said array driven by clock signals, said circuitry comprising:

disabling means coupling at least one of said voltage signals to said control circuitry for inhibiting the delivery of said one voltage signal to said control circuitry, said disabling means comprising a circuit path, said path being open when said array is malfunctioning and said path being closed when said array is properly functioning;

first gating means enable by a first control signal and coupled to said clock signals for generating first conditional clock signals, said first gating means being coupled to said first control signal via a first transistor responsive to said disabling means; and second gating means enabled by a second control signal and coupled to said clock signals for generating second conditional clock signals.

19. The circuit of claim 18 wherein said circuit path comprises a breakable fuse.

20. The circuit of claim 19 wherein said breakable fuse comprises a metal strip.

21. The circuit of claim 18 further comprising OR gating means responsive to a third and a fourth control signal for generating said second control signal.

22. The circuit of claim 21 further comprising third gating means for generating said third control signal, said third gating means coupled to a fifth control signal and enabled by said first transistor.

* * * * *